United States Patent [19]

Rall et al.

[11] 4,443,773

[45] Apr. 17, 1984

[54] SWITCHING NETWORK FOR MEGAHERTZ FREQUENCY SIGNALS

[75] Inventors: Bernhard Rall, Ulm; Johann Burkhart, Senden; Klaus Schlüter, Ulm-Gögglingen, all of Fed. Rep. of Germany

[73] Assignee: Licentia Patent-Verwaltungs-GmbH, Frankfurt am Main, Fed. Rep. of Germany

[21] Appl. No.: 341,521

[22] Filed: Jan. 21, 1982

[30] Foreign Application Priority Data

Jan. 22, 1981 [DE] Fed. Rep. of Germany ....... 3101932

[51] Int. Cl.$^3$ .......................... H01P 1/15; H04Q 3/00
[52] U.S. Cl. .................................... 333/104; 307/491; 330/51; 340/825.89; 340/825.93
[58] Field of Search ....................... 333/101, 103, 104; 358/181; 179/18 GF; 340/825.85, 825.86, 825.89, 825.9, 825.93; 330/51; 307/490, 491

[56] References Cited

U.S. PATENT DOCUMENTS 3,789,151  1/1974  Richards .
4,128,742  12/1978  Davis .......................... 340/825.93 X
4,346,381  8/1982  Bauch et al. .................... 340/825.93

FOREIGN PATENT DOCUMENTS 2339757  2/1973  Fed. Rep. of Germany .
2503102  5/1977  Fed. Rep. of Germany .

OTHER PUBLICATIONS

Rall et al, "Bildfernsprechkoppelfeld mit integrierten Halbleiterkoppelpunkten" *Nachrichtentechnische Zeitschrift* vol. 33, Sep. 1980 pp. 602–607.
Welzenbach et al. "Der Einsatz von optischen Sys-tememn in Breitbandverteilanlagen" *Wiss. Ber AEG-Telefunken* 53 (1980) pp. 62–71.
Beuss et al., "TN-Fernsprechsystem 6030 Zeitmultiplex mit farbtüchtigem electronischen Videokoppelfeld" *Telefonbau und Normalzeit*, (1980) Heft 82, pp. 1 through 8.

*Primary Examiner*—Paul L. Gensler
*Attorney, Agent, or Firm*—Spencer & Frank

[57] ABSTRACT

In a switching network in matrix form for megahertz frequency signals, including: a multilayer printed circuit board having a plurality of row signal lines located in a first plane, a plurality of column signal lines located in a second plane and extending transverse to the row lines, the row and column signal lines intersecting one another in an intersection area, control and/or shielding conductors surrounding the lines, and metal shields enclosing the planes; a crosspoint array integrated on a chip and providing a plurality of crosspoints for the intersection area, each crosspoint presenting two semiconductor switches arranged to couple a respective column signal line to a respective row signal line; and a shielded package enclosing the chip, each line is constituted by a balanced pair of stripline conductors and is terminated at each end by its characteristic impedance. Between two signal conductor pairs in a plane there are control or power-supply conductors which are grounded for high frequencies for shielding purposes. Each crosspoint includes a balanced amplifier having two amplifying paths with internal neutralization of crosstalk via additional non-operating transistors, and high impedance input and output circuits connecting the amplifier between its row and column lines, and the module is connected to the circuit board via plug-in socket elements fastened to the circuit board and mating plug connector pins fastened to the shielded package.

8 Claims, 9 Drawing Figures

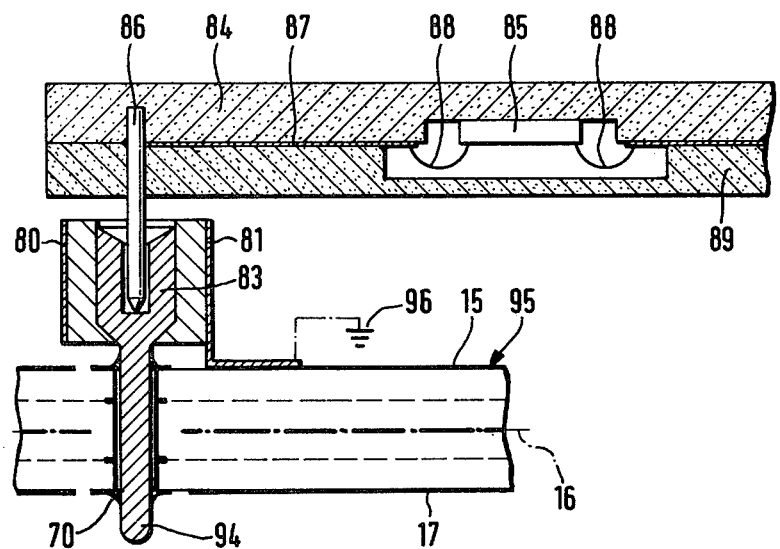
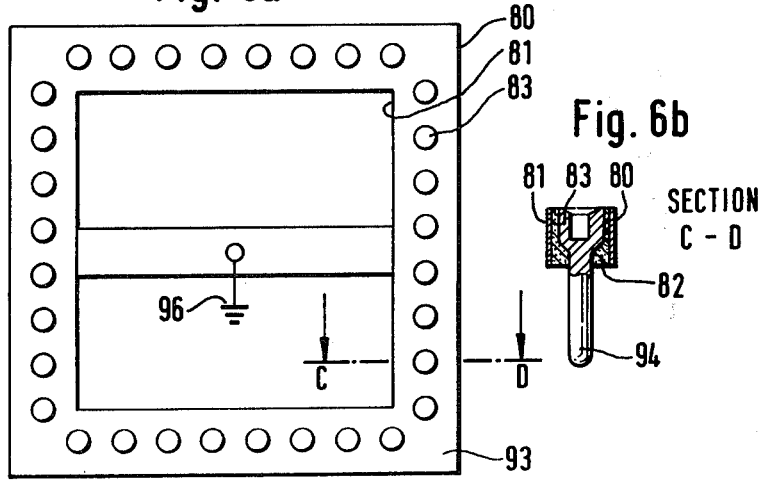

SWITCHING NETWORK FOR MEGAHERTZ FREQUENCY SIGNALS

BACKGROUND OF THE INVENTION

The present invention relates to a broadband switching network for megahertz frequency signals of the type described in the periodical Nachrichten der Telefonbau & Normalzeit (1980) Heft 82, "TN-Fernsprechsystem 6030 Zeitmultiplex mit farbtüchtigem elektronischen Video-Koppelfeld" [TN-Nachrichten Telefonbau und Normalzeit (1980), No. 82, "TN 6030 time-division multiplex system with color-compatible electronic video matrix panel], by Bruno Beuss, Peter Loewenhoff, Bernhard Rall, Rudolf Saumweber.

The switching network described therein connects together forty video telephone subscribers by means of semiconductor crosspoints. For this purpose, use is made of a triangular switching network which has one crosspoint for each connection but is provided with two switches, one for each one of the two transmission directions for the video telephone signals to be transmitted between two subscribers. The subscribers are connected through the crosspoint in a manner which is unbalanced with respect to ground.

Monolithically integrated crosspoint arrays having 5×2 crosspoints, each composed of two switches, are used for this purpose. For better decoupling, such semiconductor modules are assembled in a forty-pin ceramic package having a copper shield on all sides. For the same reasons, all lines carrying video signals are enclosed by shielding or control lines. All of these lines are accommodated in a multilayer printed circuit board.

The above-described broadband switching network is operated at frequencies up to 10 megahertz.

There exists a need for a switching network capable of handling even higher frequencies because of the ever increasing shortage of frequencies for cable television systems in which, for example, 30 television channels must be distributed to individual subscribers in such a manner that each subscriber can receive a number of these channels. In addition, care must be taken, under certain circumstances, to allow different subscribers to receive different combinations of channels. Distribution is then preferably effected in that carrier frequency range in which television receivers handle broadcast signal reception, as discussed in the article in Wissenschaftliche Berichte AEG-Telefunken [Scientific Reports from AEG-Telefunken], Vol. 53 (1980) 1-2, at pages 62-71.

SUMMARY OF THE INVENTION

For these and other cases involving frequencies which lie significantly above the video band of television signals, it is an object of the present invention to provide a switching network in which sufficient decoupling is assured between signal lines which do not happen to be connected together via a crosspoint.

The above and other objects are achieved, according to the invention, in a switching network in matrix form for megahertz frequency signals, including: a multilayer circuit board having a plurality of row signal lines located in a first plane, a plurality of column signal lines located in a second plane and extending transverse to the row lines, the row and column signal lines intersecting one another in an intersection area, control and/or shielding conductors surrounding the lines, and metal shields enclosing the planes; at least one crosspoint array module integrated on a chip and providing circuit means defining a plurality of crosspoints for the intersection area, each crosspoint presenting two semiconductor switches arranged to couple a respective column signal line to a respective row signal line; and a shielded package enclosing the module, in that: each line is constituted by a balanced pair of stripline conductors terminated at each end of the line by the characteristic impedance of the line;

there are two control or shielding conductors between every two signal lines in each plane;

the stripline conductors of at least one line are twisted at at least one point along their length, with one stripline conductor crossing the other via a portion located in a plane other than that of the one line;

the circuit board further includes, in each plane, two current supply conductors associated with the conductors of an intersection area and bordering their associated conductors; and blocking capacitors connected to the current supply conductors and located in regions of the board which are free of conductors;

each crosspoint defined by the circuit means includes: a switchable balanced amplifier; an input circuit connecting the input of the amplifer to one of the lines which is coupled by the crosspoint, and having a high input resistance relative to the characteristic impedance of that line to which it is connected; and an output circuit connecting the output of the amplifier to the other one of the lines which is coupled by the crosspoint, and having a high output resistance relative to the characteristic impedance of that line to which it is connected;

each amplifier includes: two active transistors connected to one another in a manner which is balanced to ground and each controllable between a conductive, essentially linearly amplifying state and a blocking state; and two further transistors of the same conductivity type as the active transistors and connected to one another in a manner which is balanced to ground and to be permanently in a blocking state to serve as compensation elements, each further transistor having its emitter connected to the emitter of a respective active transistor and its collector connected to the collector of the other active transistor, whereby the further transistors compensate the residual crosstalk of the active transistors when in their blocked state;

the circuit board further includes sockets for connecting the crosspoint array module to the lines in its associated intersection area;

the shielded package includes contact pins and signal leads connected to the chip for coupling the crosspoint array module to the sockets; and the switching network further includes means providing electric field shielding for at least one of: the sockets; the contact pins; and the signal leads.

The starting point of the present invention is a switching network composed of integrated crosspoint array modules, with each module being provided for a plurality of crosspoints, and a multilayer circuit board with signal lines which are arranged in rows and columns in different planes and which are accompanied on that board by control and/or shielding lines, with the planes lying between respective metallic shielding planes.

Such a switching network is to be made suitable for broadband frequency ranges lying above the video range and interferences to ground potential and operating voltages are to be substantially avoided.

For this purpose, the signal lines are designed as balanced pairs of striplines which are terminated by their characteristic impedance and each of which lies between high frequency grounded conductors serving as control or current supply lines. In addition, the pairs of signal conductors are twisted and the crosspoints are constituted by switchable, balanced, high-resistance amplifiers. These amplifiers are equipped with compensation elements for compensating the residual crosstalk when the crosspoint is blocked. In the crosspoint array modules as well, the signal lines are shielded relative to the chip.

Such switching networks can be used with preference for the distribution of carrier frequency television programs.

The advantageous total effect of the invention results from the concept of balanced switching, which yields the following individual advantages:

Lower crosstalk via ground plane and power supply conductors;

Crosstalk equalization for capacitive and inductive coupling of the lines; and

Only little crosstalk via the semiconductor substrate.

An additional advantage is that plug-in crosspoint array modules can be used. By using switched amplifiers in the crosspoints, the capacitive load on the signal lines can be kept relatively low. Noise characteristics can be improved if transistors having a low base resistance and low capacitance are used. A low capacitance permits small currents and thus low shot noise.

A preferred embodiment of the invention will now be described in detail with the aid of the drawings.

BRIEF DESCRIPTION OF THE DRAWING

FIG. 5 is a cross-sectional detail view through the center of such a crosspoint array module and the center of an associated plug-in connection.

FIG. 6a is a top view of the socket of such a crosspoint array module.

FIG. 6b is a cross-sectional view along the section line C-D of FIG. 6a.

DESCRIPTION OF THE PREFERRED EMBODIMENTS

Figure 1:
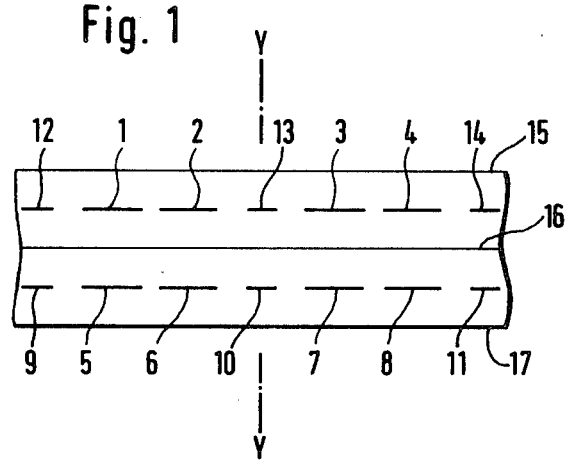
FIG. 1 is a simplified cross-sectional view of a multilayer printed circuit board with a basic conductor arrangement in the preferred embodiment of the invention.

FIG. 1 is a simplified cross-sectional view of a multilayer circuit board equipped with signal conductor paths 1, 2, 3 and 4 and shielding conductor paths 12, 13 and 14, which are arranged in the manner of a sandwich in a plane between two shielding planes 15 and 16, as well as signal conductor paths 5, 6, 7 and 8 and shielding conductor paths 9, 10 and 11 which are arranged in the manner of a sandwich in a further plane lying between the shielding planes 16 and 17. In order to clarify the arrangement of the conductors, FIG. 1 shows the layer between planes 16 and 17 rotated by 90° about an axis y—y perpendicular to the planes. Between layers 15, 16 and 17 the conductor paths are embedded in insulating material.

In the actual structure depicted, paths 5-11 extend perpendicular to paths 1-4 and 12-14 and parallel to the plane of FIG. 1.

The signal conductors 1 and 2,; 3 and 4; 5 and 6 and 7 and 8 are each pairs of a signal line, or loop, with pairs 1, 2 and 3, 4 extending, in pairs, between the shielding conductors 12 and 13, and 13 and 14, respectively, and representing, for example, the row signal lines of a switching matrix.

The pairs of signal conductors 5, 6 and 7, 8 extend, as evident from the rotated illustration, likewise in pairs between the shielding conductors 9 and 10, and 10 and 11, respectively, and represent, for example, the column signal lines of a switching matrix. The conductors 5-11 thus, in fact, extend perpendicular to the lines 1-4 and 12-14, although this is not apparent in FIG. 1 because the latter lines have been rotated by 90° about axis y—y to permit the spatial relation therebetween to be depicted.

The shielding conductor paths 9-14 may be connected as high frequency ground signal lines or current supply lines. The pairs of signal conductors 1 and 2; 3 and 4; 5 and 6; and 7 and 8 form pairs of balanced striplines.

Figure 2:
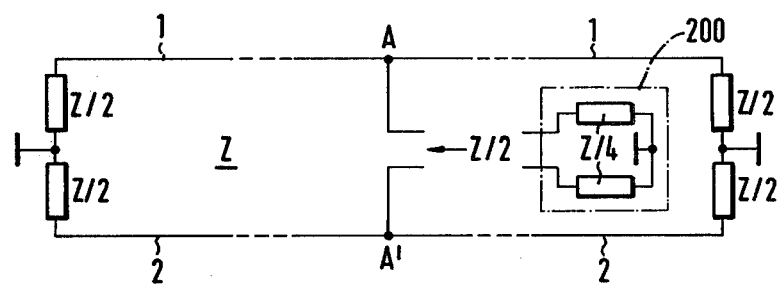
FIG. 2 is a high frequency equivalent circuit diagram for a signal line of such embodiment.

FIG. 2 shows the high frequency (HF) signal equivalent circuit diagram, for example, for the signal conductor pair 1, 2. The signal conductor pair has the characteristic impedance Z and is terminated at its end by a series connection of two resistors each having a characteristic impedance Z/2. The point of connection between the two resistors is connected to a point at ground potential with respect to high frequencies.

Along the signal lines there are several branches, one of which is shown. This branch is marked A, A'. When the line 1, 2 is terminated at each end by impedance Z, the input resistance at such a branch is Z/2. The broken-line box 200 shows the equivalent circuit diagram for this input resistance, which is formed as a series connection of two resistors each having resistance value of Z/4 and having their point of connection connected to a point at ground potential with respect to high frequencies.

Figure 3:
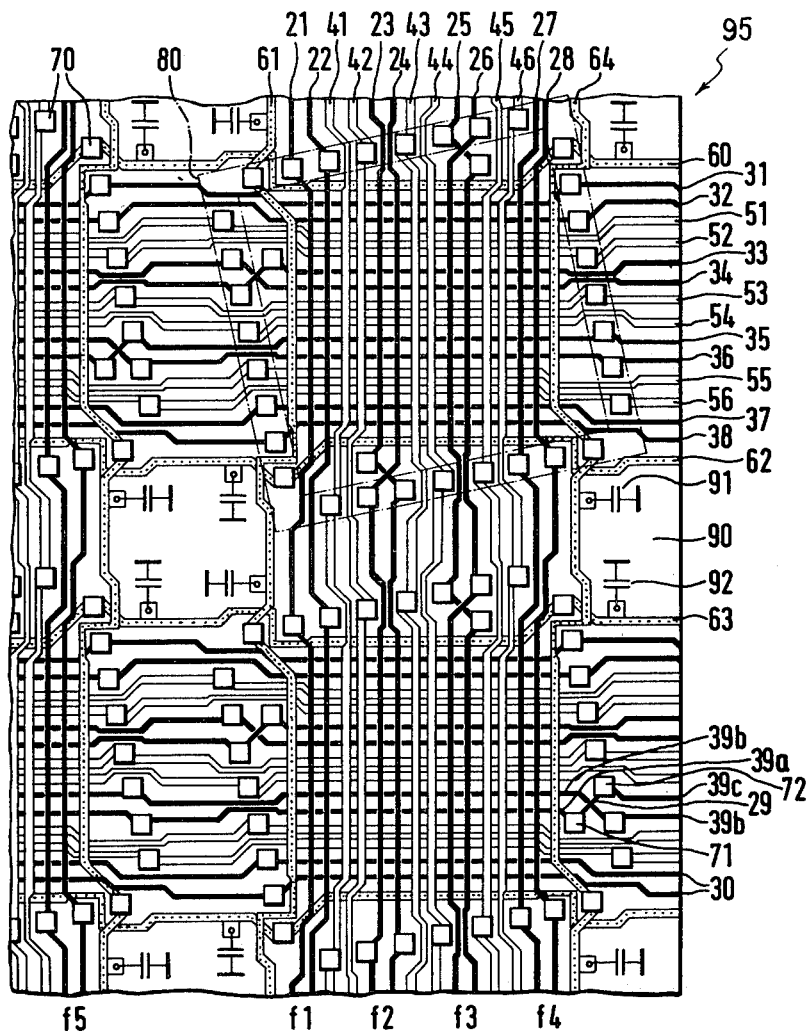
FIG. 3 is a pictorial plan view of the layout for the signal carrying conductor planes of a multilayer circuit board of such embodiment.

FIG. 3 shows the layout for the signal conducting conductor planes of a multilayer circuit board 95. In this figure, column signal conductors 21-28 are shown in solid lines, as are row signal conductors 31-38, which are in a different plane than conductors 21-28. Between each two column signal conductors or each two row signal conductors there are disposed, likewise in the same respective plane, a respective pair of control signal conductors 41-46 or 51-56.

The groups formed, on the one hand, by the column signal conductors 21-28 and the control signal conductors 41-46 and, on the other hand, by the row signal conductors 31-38 and the control signal conductors 51-56 are surrounded, in their respective planes, by column current supply conductors 61 and 64 and row current supply conductors 60, 62 and 63 extending along the edges of their respective groups. The current supply conductors lie in their respectively associated planes and are distinguished in the drawing from the other conductors by dotted lines.

The areas of intersection of the groups, with each group including four row or column signal lines, or four pairs of signal conductor paths, are all designed identically. Each group of four pairs of signal lines can be connected via eight plated-through holes 70 of a set of thirty-two such holes arranged in a square pattern. A crosspoint array module for four times four (4×4) crosspoints should be arranged above each of the intersections, the electrical connections being made by plug-in connections. Such plug-in connections form a square for the square package for each 4×4 crosspoint array module in which the elements for the plug-in connection are accommodated between two metallized side walls 80 and 81 of a circumferential channel, as shown in detail in FIGS. 5 and 6.

In order to be able to twist the pairs of signal conductors in signal lines for different lengths, it is necessary, at the points of intersection provided for this purpose, to provide a detour for one conductor via the other conductor plane. For example, the row signal conductor 39a, at the bottom right of FIG. 3, must be brought around the row signal conductor 39b in such a manner that it passes, via a plated-through hole 71 and a detour 29, in the plane of the column signal conductors. From there it travels, via a plated-through hole 72 back into the plane of the row signal conductors where it continues as row signal conductor 39c.

In regions 90 which are free of conductors, between the respective four crossover regions of four conductor groups, there are provided blocking capacitors 91, 92 which are connected, on the one hand, to current supply conductors 62, 63, 64, etc. and, on the other hand, to ground, for high frequency decoupling directly at the crosspoint array modules which are to be supplied with current by the switching network and for which the current is supplied by the current supply lines.

If, for example, the column signal lines carry television channels with respectively different carrier frequencies f1, f2, f3 and f4, it is possible, by corresponding switching of crosspoints connected to the row signal lines to take care that one, two, three or four of those television channels reach a row signal line 30 connected to an output, located at the bottom right of FIG. 3, and are thus provided to a particular television subscriber. The television subscriber can then select any one of the four channels by means of the channel selector arrangement of his receiver. Further programs with carrier frequencies f5 etc. may be carried in an adjacent group of column signal lines. From these as well, programs can be switched to the row signal line 30.

Advantageously, as can be seen in FIG. 3, the edges of each crosspoint array module package are arranged at an angle of about 12° with respect to the directions of the conductor groups. This has been found to be advisable because it is then easier to bring conductors through between the plated through holes 70 without providing a zigzag path for the wiring, which would take up unnecessary space.

A plurality of crosspoints are disposed on one semiconductor chip in a crosspoint array module package. Within the package, leads disposed between metallic shields lead from the plug-in connections at the edge of the crosspoint array module to the semiconductor chip.

Figure 4:
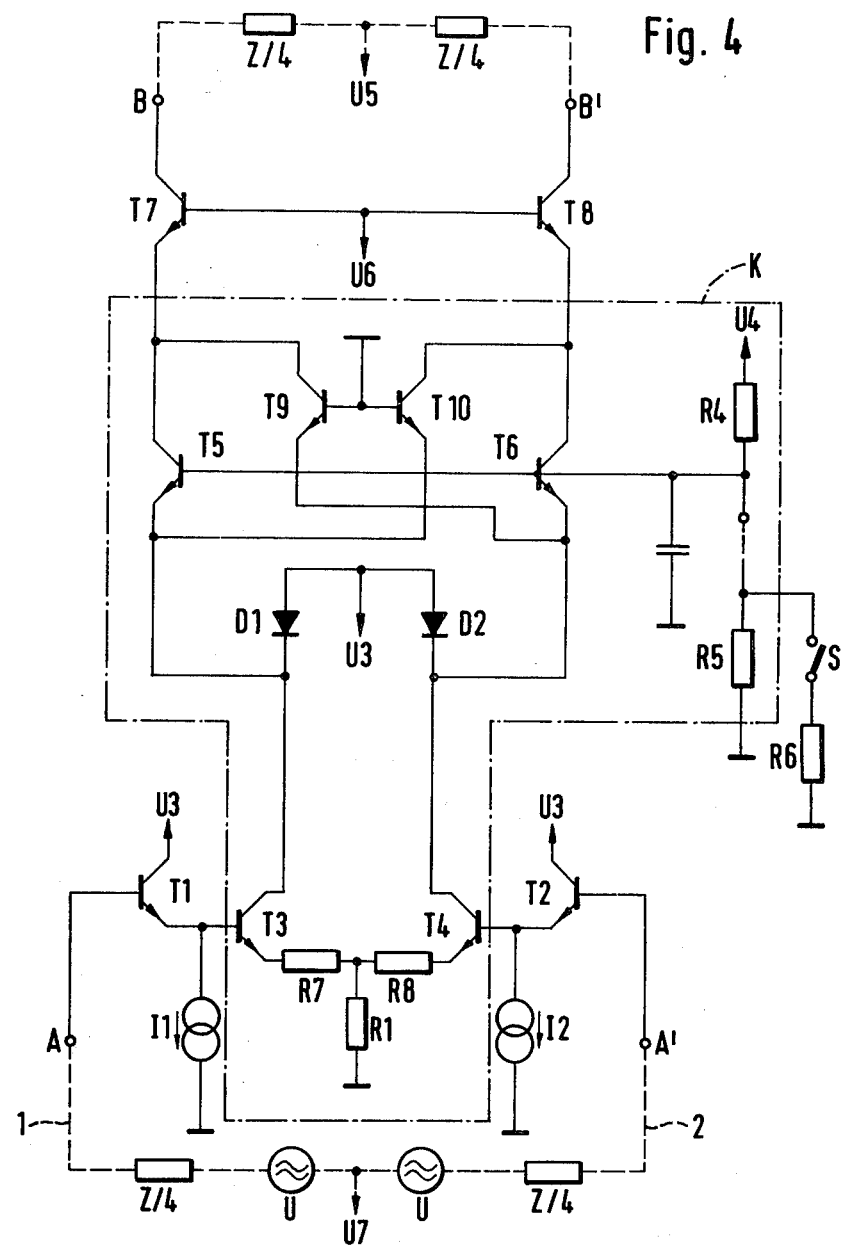
FIG. 4 is a circuit diagram for a crosspoint on the chip of a crosspoint array module of such embodiment.

FIG. 4 presents a simplified circuit diagram for one crosspoint in a crosspoint array module. The actual crosspoint K lies within the broken line box. One crosspoint array module accommodates 4×4=16 crosspoints and additionally four input circuits and four output circuits.

One input and one output circuit belonging to a crosspoint K are also shown in FIG. 4. The input circuit is composed of transistors T1 and T2 while the output circuit is composed of transistors T7 and T8. The signals to be switched via a crosspoint come from a branch A, A' of column signal line 1, 2, and specifically the unit 200 of the equivalent circuit of FIG. 2, from balanced signal voltage sources U each via an internal resistor Z/4. If the characteristic impedance of a column signal line is, for example, Z=40 Ohms, then Z/4=10 Ohms.

FIG. 4 shows these signal voltage sources U with internal resistance Z/4, signal conductors 1 and 2 and branch A, A' in broken lines. Transistors T1 and T2, for which direct voltage sources U7 and U3 and direct current sources I1 and I2 are provided, are controlled starting from the branch points, A, A'. The transistors T1 and T2 serve as input circuits whose input resistance is high compared to the resistance Z, in particular more than one hundred times higher.

This input circuit initially controls transistors T3 and T4 of the crosspoint, which have a common emitter resistor R1 and for which a voltage source U3, which may be the same as that for transistors T1 and T2, provides a voltage supply via diodes D1 and D2. Signals transmittted by transistors T3 and T4 can be switched through via switchable, ground symmetrical amplifiers in the form of transistors T5 and T6, which serve as switches. Their common control, or switching, is effected initially by the voltage across a resistor R4 connected to a direct voltage source U4. Resistor R4, together with a control circuit which is not part of the crosspoint on the chip, forms a voltage divider including the resistor R5 and, if switching contact S is closed, the resistor R6. In the latter case, resistor R6, whose resistance value is only 100 Ohms and which is shown as a substitute for a saturated transistor, will reduce the base potential across the transistors T5 and T6 to such an extent that the latter are blocked. Those transistors are conductive when the switching contact S is open. In this switched-through, or conductive, state, a conductive connection is established between the branch points A and A', on the one hand, and comparable output points B and B' of a row signal line on the other hand, which is also symbolized by equivalent series resistances Z/4. A supply voltage is furnished via the row signal line from a direct voltage source U5 for the output circuit formed by transistors T7 and T8 which provide an output resistance compared to the row signal line.

The bases of transistors T7 and T8 receive a bias voltage from a direct voltage source U6. In a similar manner, the bias voltage source U7 imparts, via the column signal line and the branch points A, A', a base bias for the transistors T1 and T2.

The high resistance of the output circuit T7, T8 is particularly important because a plurality of switched-through crosspoints may be connected to the row signal line to commonly supply the row signal line, i.e. the signal line with the outgoing signals, and can discontinuously vary the characteristic impedance of the row signal line.

If the transistors T5 and T6, which serve as switches, are blocked, there nevertheless exists the danger that a weak signal can travel from branch point A to branch point B or from branch point A' to branch point B', respectively. To compensate these weak signals, transistors T5 and T6 have associated identical transistors T9 and T10 which are always blocked but which nevertheless couple, on the one hand, weak signals from the emitter of transistor T6 to the collector of transistor T5 and, on the other hand, from the emitter of transistor T5 to the collector of transistor T6. These weak signals, however, are in phase opposition to the signals coupled to the output via transistors T5, T6 and therefore have a compensating effect with respect to the so-called residual crosstalk via the blocked transistors T5 and T6.

By means of resistors R7 and R8 in the emitter leads of the transistors T3 and T4, respectively, the linearity of the switching network can be increased, at the expense of gain, so that the high demands with respect to freedom from third harmonic distortion, i.e. an intermodulation attenuation of more than 69 dB can be realized in the range from 5 to 17 mV at the input A, A' with a voltage gain of 0.3 at 100 MHz. The lower limit of 5 mV at input A, A' is given by the demand for a signal to noise ratio of more than 55 dB. The direct current through the common emitter resistor R1 of the transistors T3 and T4 is about 3 to 4 mA.

Switch S and resistor R6 may be realized by a transistor controlled by a flip-flop which is selected by a decoding logic network, which selects one crosspoint relative to the applied code at the control inputs of the crosspoint array module. This logic circuitry is integrated on the same silicon chip.

One such crosspoint K would be provided in a crosspoint array module for each combination of input and output lines at a region of intersection between a group of row conductors and a group of column conductors. Thus for the arrangement shown in FIG. 3, a respective crosspoint K would be provided between line 21, 22 and each of lines 31, 32; 33, 34; 35, 36; and 37, 38. Similar groups of points K would be provided between each of lines 23, 24; 25, 26; and 27, 28 and each of the above-mentioned output lines. Thus, the crosspoint array module for one such intersection region of FIG. 3 would include sixteen crosspoint circuits K, each separately actuable.

FIG. 5 is an enlarged cross-sectional view through the center of a crosspoint array module and a plug-in connection. In a recess of a ceramic plate 84 there is disposed a semiconductor chip 85 constituting the actual crosspoint array module and provided with circuits according to FIG. 4. Beginning at pins 86, conductor paths 87 extend on one side of the ceramic plate 84 to the chip 85, with bond wires 88 establishing connections between the conductor paths 87 and the chip 85. Finally, the recess and the chip 85 are covered by a cover plate 89. The outer surfaces of the ceramic plate 84 and of the cover plate 89, which together form a package are metallized in the immediate vicinity of the pins 86 for the purpose of shielding, with the metallization and the chip bottom, i.e. the recess area, being connected to negative ground via one or a plurality of pins 86.

FIG. 6a is a top view of an associated socket 93 of a crosspoint array module, while FIG. 6b is a detailed sectional view through the line C-D. The package 84, 89 is square and is provided along each one of its four sides with eight pins 86. The complete socket 93 includes 32 socket elements 83 arranged in a pattern corresponding to that of pins 86 of associated package. Socket 93 has a frame-like configuration. One of the socket element 83 is shown in the cross-sectional view of FIG. 6b. The element 83 includes a pin-shaped part 94 for insertion into, and soldering to, one of the plated-through holes 70, 72 shown in FIG. 3 of the multilayer circuit board, which circuit board is designated as 95 in FIG. 5. The socket element 83 is disposed between metallized walls 80 and 81 which serve as a shield for the plug-in connections consisting of the pins 86 of the package and the socket elements 83 of shielded socket 93 and are connected to ground potential 96.

The socket 93 shown in FIG. 6a can also be formed by four strips each having eight pocket element 83, or each being a single in-line socket, each strip then being shielded separately. Each one of these strips can be provided, for example, with a soldering lug connected with the shielding which lug must be soldered to a ground line of the multilayer circuit board.

Figure 7:
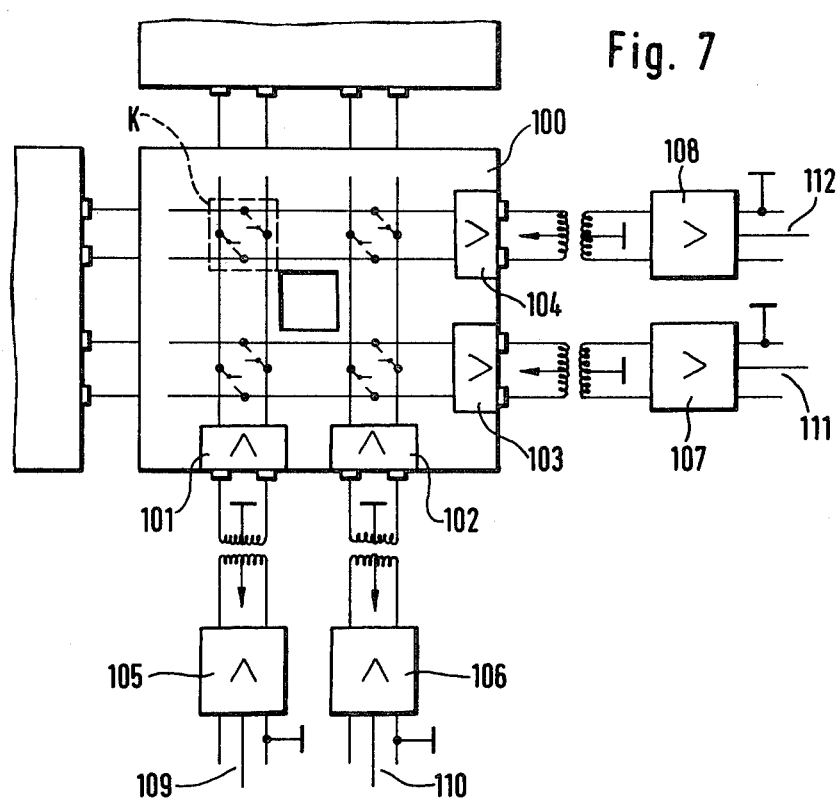
FIG. 7 is a circuit diagram of the basic external connections of such a crosspoint array module.

FIG. 7 shows, for clarification, the connection of a simplified crosspoint array module to one corner of a switching matrix. The simplified crosspoint array module here includes only a 2×2 crosspoint array module, two points each being associated with a respective common input circuit 101 or 102, each corresponding to T1 and T2 of FIG. 4, and two points each being associated with a respective output circuit 103 or 104, each corresponding to T7 and T8 of FIG. 4. Each crosspoint K itself is indicated in FIG. 7 by two small switching contacts. This Figure shows primarily how the switching matrix has associated input amplifiers 105 and 106 at its inputs and output amplifiers 107 and 108 at its outputs. With the aid of these amplifiers, a transition is made from unbalanced input lines 109 and 110 or output lines 111 and 112, respectively, to balanced lines within the crosspoint array module 100. Transformers T serve to make the transistion between the input and output amplifiers, respectively, and the crosspoint array module.

Figure 8:
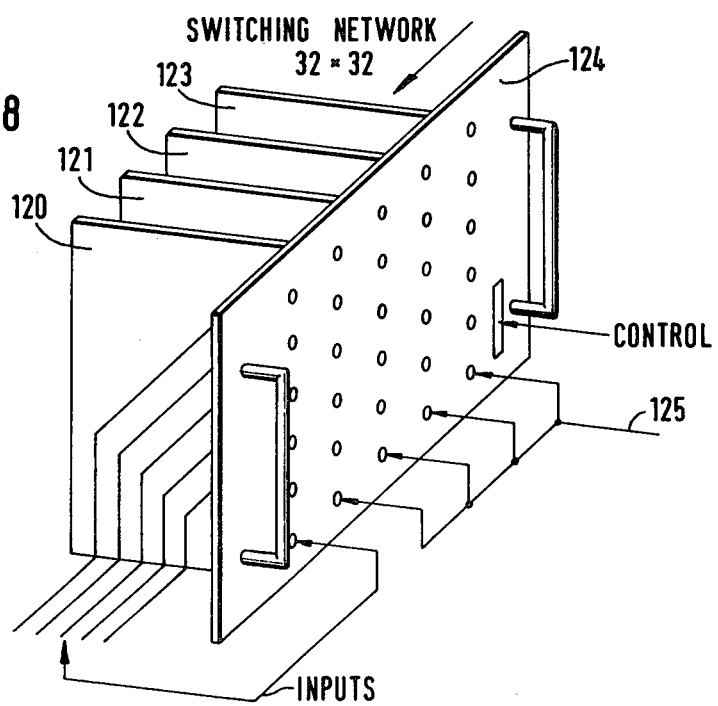
FIG. 8 is a perspective view of a distributor switching network employing a plurality of such multilayer circuit boards.

FIG. 8 shows a distributor switching network having a plurality of identical switching matrices 120 to 123, each having thirty-two times thirty-two inputs and outputs, respectively. For better ventilation, the switching matrix printed circuit boards are oriented vertically and have a common output conductor plate 124 carrying output sockets 125 which are shown only schematically. The number of sockets 125 results from the product of the number of switching matrices 120 to 123 and the number, e.g. in this case thirty-two, of outputs per switching matrix. With such a distributor switching network it is possible, for example, to distribute any combination of thirty-two television channels, which are present at the existing thirty-two inputs, to each of a large number of subscribers.

It will be understood that the above description of the present invention is susceptible to various modifications, changes and adaptations, and the same are intended to be comprehended within the meaning and range of equivalents of the appended claims.

What is claimed is:

1. In a switching network in matrix form for megahertz frequency signals, including:
a multilayer printed circuit board having a plurality of row signal lines located in a first plane, a plurality of column signal lines located in a second plane and extending transverse to the row lines, the row and column signal lines intersecting one another in an intersection area, control and/or shielding conductors surrounding the lines, and metal shields enclosing the planes; at least one crosspoint array module integrated on a chip and providing circuit means defining a plurality of crosspoints for the intersection area, each crosspoint presenting two semiconductor switches arranged to couple a respective column signal line to a respective row signal line; and a shielded package enclosing the module, the improvement wherein:

each said line is constituted by a balanced pair of stripline conductors terminated at each end of said line by the characteristic impedance of said line;

there are two of said control or shielding conductors between every two lines in each said plane;

said stripline conductors of at least one said line are twisted at at least one point along their length, with one said stripline conductor crossing the other via a portion located in a plane other than that of said one line;

said circuit board further comprises, in each said plane: two current supply conductors associated with the conductors of an intersection area and bordering their associated conductors; and blocking capacitors connected to said current supply conductors and located in regions of said board which are free of conductors;

each said crosspoint defined by said circuit means comprises: a switchable balanced amplifier; an input circuit connecting the input of said amplifier to one of said lines which is coupled by said crosspoint, and having a high input resistance relative to the characteristic impedance of that said line to which it is connected; and an output circuit connecting the output of said amplifier to the other one of said lines which is coupled by said crosspoint, and having a high output resistance relative to the characteristic impedance of that said line to which it is connected;

each said amplifier comprises: two active transistors connected to one another in a manner which is balanced to ground and each controllable between a conductive, essentially linearly amplifying state and a blocking state; and two further transistors of the same conductivity type as said active transistors and connected to one another in a manner which is balanced to ground and to be permanently in a blocking state to serve as compensation elements, each said further transistor having its emitter connected to the emitter of a respective active transistor and its collector connected to the collector of the other said active transistor, whereby said further transistors compensate the residual crosstalk of said active transistors when in their blocked state;

said circuit board further comprises socket elements for connecting said module to said lines in its associated intersection area;

said shielded package comprises plug connector pins and signal leads connected to said chip for coupling said module to said socket elements; and said switching network further comprises means providing electric field shielding for at least one of said socket elements, said plug connector pins, and said signal leads.

2. Switching network as defined in claim 1 wherein at least one plated-through hole provided for insertion of one said socket element is arranged for connecting said stripline conductor portion located in said other plane to the remainder of that said conductor.

3. Switching network as defined in claim 1 or 2 wherein said shielded package is essentially square and said row and column lines extend at an acute angle to the sides of said package.

4. Switching network as defined in claim 1 further comprising control means connected for controlling the switching of said amplifiers of a plurality of crosspoints which are associated with a respective signal line.

5. Switching network as defined in claim 1 wherein said signal lines in one said plane are connected to receive signals at respectively different carrier frequencies and are connected to said input circuits of respective cross points of one said module, so that each crosspoint of said one module receives a respectively different carrier frequency.

6. Switching network as defined in claim 1 further comprising input amplifiers each connected to a respective signal line in one said plane and output amplifiers each connected to a respective signal line in the other said plane, each of said input and output amplifiers being constructed for matching the characteristic impedance of its associated line and for effecting a transformation of balanced to unbalanced transmission and vice versa.

7. Switching network as defined in claim 1 wherein said crosspoint array module presents a matrix of four times four crosspoints.

8. Switching network as defined in claim 1 forming part of a distributor switching network in which the inputs of a plurality of identical switching networks are connected in parallel with one another, the distributor switching network including a common output conductor plate provided with sockets connected to the outputs of the plurality of switching networks.

* * * * *